(12) United States Patent
Kida et al.

(10) Patent No.: US 8,817,055 B2
(45) Date of Patent: Aug. 26, 2014

(54) DATA TRANSFER CIRCUIT AND FLAT DISPLAY DEVICE

(75) Inventors: Yoshitoshi Kida, Kanagawa (JP); Yoshiharu Nakajima, Kanagawa (JP)

(73) Assignee: Japan Display West Inc., Aichi-Ken (JP)

( * ) Notice: Subject to any disclaimer, the term of this patent is extended or adjusted under 35 U.S.C. 154(b) by 997 days.

(21) Appl. No.: 10/561,870

(22) PCT Filed: Jul. 6, 2004

(86) PCT No.: PCT/JP2004/009902
§ 371 (c)(1),
(2), (4) Date: Dec. 21, 2005

(87) PCT Pub. No.: WO2005/004102
PCT Pub. Date: Jan. 13, 2005

(65) Prior Publication Data
US 2007/0109282 A1    May 17, 2007

(30) Foreign Application Priority Data
Jul. 7, 2003  (JP) ................. P2003-192626

(51) Int. Cl.
*G09G 5/10*    (2006.01)
*H03K 3/037*   (2006.01)
*G09G 3/36*    (2006.01)
*H03K 3/356*   (2006.01)
*G11C 19/00*   (2006.01)

(52) U.S. Cl.
CPC ...... *H03K 3/356156* (2013.01); *G09G 2330/02* (2013.01); *G11C 19/00* (2013.01); *G09G 2330/021* (2013.01); *G09G 2310/0289* (2013.01); *H03K 3/0375* (2013.01); *G09G 2310/0294* (2013.01); *G09G 2300/0408* (2013.01); *G09G 3/3688* (2013.01); *G09G 2130/027* (2013.01)
USPC ......................................... 345/690

(58) Field of Classification Search
USPC ............ 327/100, 185; 345/87, 88, 89, 90, 92, 345/94, 95, 96, 99, 100, 103, 204, 205, 206, 345/207, 208, 209, 210, 211, 214, 690, 691, 345/692, 693; 349/33, 34, 36, 37, 38, 39, 349/41, 42, 46, 47, 48, 52, 54
See application file for complete search history.

(56) References Cited

U.S. PATENT DOCUMENTS 5,850,204 A  * 12/1998  Maekawa ......................... 345/98
6,275,210 B1 *  8/2001  Maekawa ......................... 345/98

(Continued)

FOREIGN PATENT DOCUMENTS

EP     0 544 461 A2    6/1993
EP     1 014 334 A2    6/2000

(Continued)

OTHER PUBLICATIONS

Japanese Office Action dated Jan. 24, 2008 for corresponding Japanese Application No. 2003-192626.

(Continued)

*Primary Examiner* — Alexander S Beck
*Assistant Examiner* — Kirk Hermann
(74) *Attorney, Agent, or Firm* — Rader, Fishman & Grauer PLLC

(57) ABSTRACT

The present invention is a data transfer circuit applicable to a liquid crystal display apparatus with a drive circuit formed integrally, for example, on an insulation substrate, and configured such that only an inverted output of a latch result of a first latch section (41) or only a non-inverted output thereof is data-transferred to a second latch section (42) and, at least during a period of data transfer to the second latch section (42), a power supply voltage of the first latch section (41) is raised.

20 Claims, 5 Drawing Sheets

(56) References Cited

U.S. PATENT DOCUMENTS

| | | | |
|---|---|---|---|
| 6,509,894 B1 * | 1/2003 | Maekawa et al. | 345/211 |
| 6,664,943 B1 * | 12/2003 | Nakajima et al. | 345/98 |
| 6,801,181 B2 * | 10/2004 | Matsumoto et al. | 345/98 |
| 6,958,750 B2 * | 10/2005 | Azami et al. | 345/204 |
| 6,989,810 B2 * | 1/2006 | Morita | 345/98 |
| 7,006,068 B2 * | 2/2006 | Haga | 345/98 |
| 7,190,342 B2 * | 3/2007 | Matsuda et al. | 345/100 |
| 7,289,097 B2 * | 10/2007 | Gyouten et al. | 345/100 |
| 2002/0018039 A1 * | 2/2002 | Morita | 345/100 |
| 2002/0024374 A1 * | 2/2002 | Ovens et al. | 327/333 |
| 2003/0011584 A1 * | 1/2003 | Azami et al. | 345/204 |
| 2003/0107535 A1 * | 6/2003 | Numao | 345/76 |
| 2004/0150607 A1 * | 8/2004 | Nakajima et al. | 345/100 |

FOREIGN PATENT DOCUMENTS

| | | | | |
|---|---|---|---|---|
| EP | 1014334 A2 * | 6/2000 | | G09G 3/36 |
| JP | 58-1884 A | 1/1983 | | |
| JP | 60-038920 | 2/1985 | | |
| JP | 60-38920 A | 2/1985 | | |
| JP | 62-265812 | 11/1987 | | |
| JP | 02-075219 | 3/1990 | | |
| JP | 2000-221926 | 8/2000 | | |
| JP | 2000221926 A * | 8/2000 | | G09G 3/20 |
| JP | 2000-242209 | 9/2000 | | |

OTHER PUBLICATIONS

International Search Report mailed Aug. 17, 2004.
Communication from European Patent Office dated Nov. 17, 2008, for application No. 04747370.7-1228.
International Search Report dated Aug. 17, 2004 for application No. PCT/JP2004/009902.
European Patent Summons to Attend Oral Proceedings Pursuant to Rule 115(1) EPC issue May 30, 2012 for corresponding European Application No. 04 747 370.7.

* cited by examiner

DATA TRANSFER CIRCUIT AND FLAT DISPLAY DEVICE

BACKGROUND OF THE INVENTION

1. Technical Field

The present invention relates to a data transfer circuit and a flat display device that can be applied to a liquid crystal display apparatus having a drive circuit formed integrally, for example, on an insulating substrate. According to the present invention, it is configured such that only an inverted output of a latch result of a first latch section or only a non-inverted output thereof is data-transferred to a second latch section, and that at least during a data transfer to the second latch section, a power supply voltage of the first latch section is raised, thereby enabling the simplification of a configuration relating to the data transfer, in a construction with TFTs and the like.

2. Background Art

Recently, in a liquid crystal display apparatus of a flat display device applicable to a portable terminal such as, for example, PDAs, portable telephones and the like, there has been provided an arrangement in which a drive circuit of a liquid crystal display panel is formed integrally on a glass substrate which is an insulating substrate constituting the liquid crystal panel.

Namely, FIG. 1 is a block diagram showing this type of a liquid crystal display apparatus. In this liquid crystal display apparatus 1, each pixel is formed with a liquid crystal cell 2, a polysilicon TFT (Thin Film Transistor) 3 as a switching element of this liquid crystal cell 2 and a hold capacitance which is not shown, and a display section 4 of a rectangular shape is formed by arranging each pixel in a matrix. In this liquid crystal display apparatus 1, by disposing a color filter to each pixel formed in the display section 4 as described above, pixels R, G, B in red, green and blue colors are repeated sequentially and cyclically in a horizontal direction, with 240 sets of red, green and blue color pixels R, G and B as one set, and pixels in the horizontal direction are formed so as to form the display section 4. In this liquid crystal display unit 1, gradation data R0-R5, G0-G5, B0-B5, each with 6 bits, for indicating the gradation of these red, green, blue color pixels R, G, B are inputted simultaneously and in parallel in the order of raster scan, and the unit is enabled to display a desired image by driving each pixel on the basis of this gradation data D1 (R0-R5, G0-G5, B0-B5).

In the liquid crystal display apparatus 1, signal lines SL and gate lines SG of the display section 4 are connected to a horizontal drive circuit 5 and a vertical drive circuit 6, respectively. The horizontal drive circuit 5 outputs a drive signal for pixels corresponding to each signal line SL on the basis of the gradation data D1, and the vertical drive circuit 6, in correspondence to an output of the drive signal to the signal line SL by this horizontal drive circuit 5, selects pixels per line unit in the display section 4 by controlling the gate lines SG. Thereby, in the liquid crystal display apparatus 1, a desired image is enabled so as to be displayed by driving each pixel in the display section 4 with these horizontal drive circuit 5 and vertical drive circuit 6.

More specifically, by selecting a plurality of reference voltages V0-V63 according to gradation data, the horizontal drive circuit 5, as described in Japanese Patent Application Publication No. 2000-242209, is enabled so as to perform a digital/analog conversion processing of the gradation data D1 and generate a drive signal. That is, in the horizontal drive circuit 5, by means of sampling latch circuits (SL) 8 that are provided corresponding to the disposition of pixels in the horizontal directions, by sequentially and cyclically sampling corresponding bits of R0-R5, G0-G5, B0-B5 of the gradation data D1, and by arranging together these gradation data D1 per line unit, they are outputted to reference voltage selectors 9 corresponding thereto. A reference voltage generating circuit 10 generates and outputs a plurality of reference voltages V0-V63 corresponding to each gradation of the gradation data D1. The reference voltage selector 9 selects the reference voltages V0-V63 outputted from this reference voltage generating circuit 10, based on the output data from each sampling latch circuit 8, and outputs a drive signal obtainable by a digital/analog conversion processing of corresponding gradation data D1. A buffer circuit 11 outputs this drive signal to a corresponding signal line SL.

FIG. 2 is a connection diagram showing a configuration for one bit portion of the sampling latch circuit 8 in the horizontal drive circuit 5 composed as described above. In the sampling latch circuit 8, after latch-holding gradation data D1 in a first latch section 21 at a timing corresponding to a position of a corresponding pixel in the horizontal direction, a latch result of the first latch section 21 is transferred and outputted to a second latch section 22 at a predetermined timing set in a vertical blanking period, thereby arranging the gradation data together per line unit and outputting it to the reference voltage selector 9. Here, with respect to active elements, such as a low temperature polysilicon TFT or the like which is formed on an insulating substrate for constructing this type of sampling latch circuit 8 or the like, there is a large dispersion in their characteristics. Therefore, in the sampling latch circuit 8, the circuit is configured to output the latch result to the second latch section 22 with a so-called bi-phase output by outputting an inverted output $1\text{Lout}_{(Inv)}$ of the latch result as well as a non-inverted output $1\text{Lout}_{(Non-inv)}$ thereof so as to ensure a stable and reliable data transfer of the latch result to be secured between the first latch section 21 and the second latch section 22.

That is, in the first latch section 21 in this sampling latch circuit 8, a CMOS inverter composed of a N-channel MOS (hereinafter referred to as a NMOS) and a P-channel MOS (hereinafter referred to as a PMOS), a gate and a drain being connected respectively in common therebetween, as well as a CMOS inverter composed of an NMOS transistor Q3 and a PMOS transistor Q4, and likewise, a gate and a drain being connected respectively in common therebetween, are provided in parallel between a positive side power supply line of power supply voltage VCC and a negative side power supply line of power supply voltage VSS. In the first latch section 21, an inverter output by means of the transistors Q1 and Q2 is inputted to an inverter composed of the transistors Q3 and Q4. Further, via a PMOS transistor Q5 operating at an inverted signal xSP of a sampling pulse SP, an inverter output by means of the transistors Q3 and Q4 is inputted to the inverter composed of the transistors Q1 and Q2, and still further, via a PMOS transistor Q6 operating at a sampling pulse SP, gradation data D1 is inputted to the inverter composed of the transistors Q1 and Q2.

Thereby, in the sampling latch circuit 8, a CMOS latch cell with a comparator configuration is formed with transistors Q1 to Q6, wherein, as shown in FIGS. 3(A) to 3(D), gradation data D1 is caused to be latched by the sampling pulse SP, and a timing of this latch is configured to be set according to the position of a corresponding pixel in the horizontal direction.

In the sampling latch circuit 8, an inverted output $1\text{Lout}_{(Inv)}$ of a latch result by this first latch section 21 and a non-inverted output $1\text{Lout}_{(Non-inv)}$ thereof are inputted to the second latch section 22, respectively, via transfer switches 25, 24. Here, this transfer switch 25, 24 turns to an ON-state at a timing OE1, for example, of a rise timing in a horizontal blanking period (FIG. 3(E)).

In the second latch section 22, a latch cell is formed with a CMOS inverter composed of an NMOS transistor Q7 and a PMOS transistor Q8, and a CMOS inverter composed of an NMOS transistor Q9 and a PMOS transistor Q10. An inverted output $1Lout_{(Inv)}$ and a non-inverted output $1Lout_{(Non-inv)}$ of the latch result inputted via the transfer switches 25, 24 are inputted to the CMOS inverter composed of the transistors Q7, Q8 and the CMOS inverter composed of the transistors Q9, Q10, respectively. Thereby, the sampling latch circuit 8 is configured to perform data transfer of a latch result of the first latch section 21 at a timing OE1 of the rise in the horizontal blanking period for latching in the second latch section 22 (FIG. 3.(F)), and to output the output 2Lout of the latch result of the second latch via an inverter 26. By way of example, in the second latch section 22, by setting a positive power supply and a negative power supply appropriately, a latch output may be outputted after level-shifting to be suitable for processing in the following reference voltage selector 9.

However, in the case of data transfer of the latch result and the like by use of the bi-phase as described above, there is a problem that its configuration becomes complicated in comparison with a data transfer by use of a single phase. If the construction relating to such data transfer can be simplified, an overall configuration can be simplified in accordance therewith, and a so-called narrow bezel can be realized in this type of display apparatus. Further, power consumption can be reduced.

DISCLOSURE OF THE INVENTION

The present invention has been contemplated in consideration of the problems described above, and the invention is intended to propose a data transfer circuit and a flat display apparatus in which the construction relating to data transfer in the configuration thereof with TFTs and the like can be simplified.

In order to solve the problems described above, the present invention is applied to a data transfer circuit in which an input data is latched in a first latch section, and a latch result of the first latch section is data-transferred to a second latch section for latching therein, in which only an inverted output of the latch result of the first latch section or only a non-inverted output of the latch result is allowed to be data-transferred to the second latch section, and in which at least during the period of data transfer of the latch result from the first latch section to the second latch section, a power supply voltage of the first latch section is caused to rise.

According to the configuration of the present invention, if only the inverted output of the latch result of the first latch section or only the non-inverted output of the latch result is data-transferred to the second latch section, the configuration thereof can be simplified accordingly in comparison with the case of the data transfer of the latch result using both of the inverted output and the non-inverted result. Further, if the power supply voltage of the first latch section is enabled to be raised at least during the period of the data transfer of the latch result from the first latch section to the second latch section, it becomes possible to expand a margin in the data transfer, thereby enabling a compensation for a decrease in the margin due to the data transfer of the latch result to the second latch section only by use of the inverted output or only by use of the non-inverted output of the latch result, by the merit of the expanded margin, and thereby ensuring a stable and reliable data transfer of the latch result.

Still further, the present invention is applied to a flat display apparatus, which includes: a plurality of latch circuits for sampling gradation data sequentially and cyclically, and distributing the gradation data to a corresponding column; and a digital/analog conversion circuit for setting an output signal level to the corresponding column depending on the latch result of the latch circuit, in which each latch circuit is configured to data-transfer only an inverted output of a latch result of a first latch section or only a non-inverted output of the latch result of the first latch section to a second latch section, and at least during the period of data transfer of the latch result of the first latch section to the second latch section, a power supply voltage of the first latch section is raised.

Thereby, according to the configuration of the present invention, in the latch circuit of the flat display apparatus, the circuit is enabled to perform data transfer of the latch result stably and reliably with a simplified configuration.

BEST MODE FOR CARRYING OUT THE INVENTION

A preferred embodiment of the present invention will be described in detail in the following by referring to the accompanying drawings.

(1) First Embodiment

Figure 1:
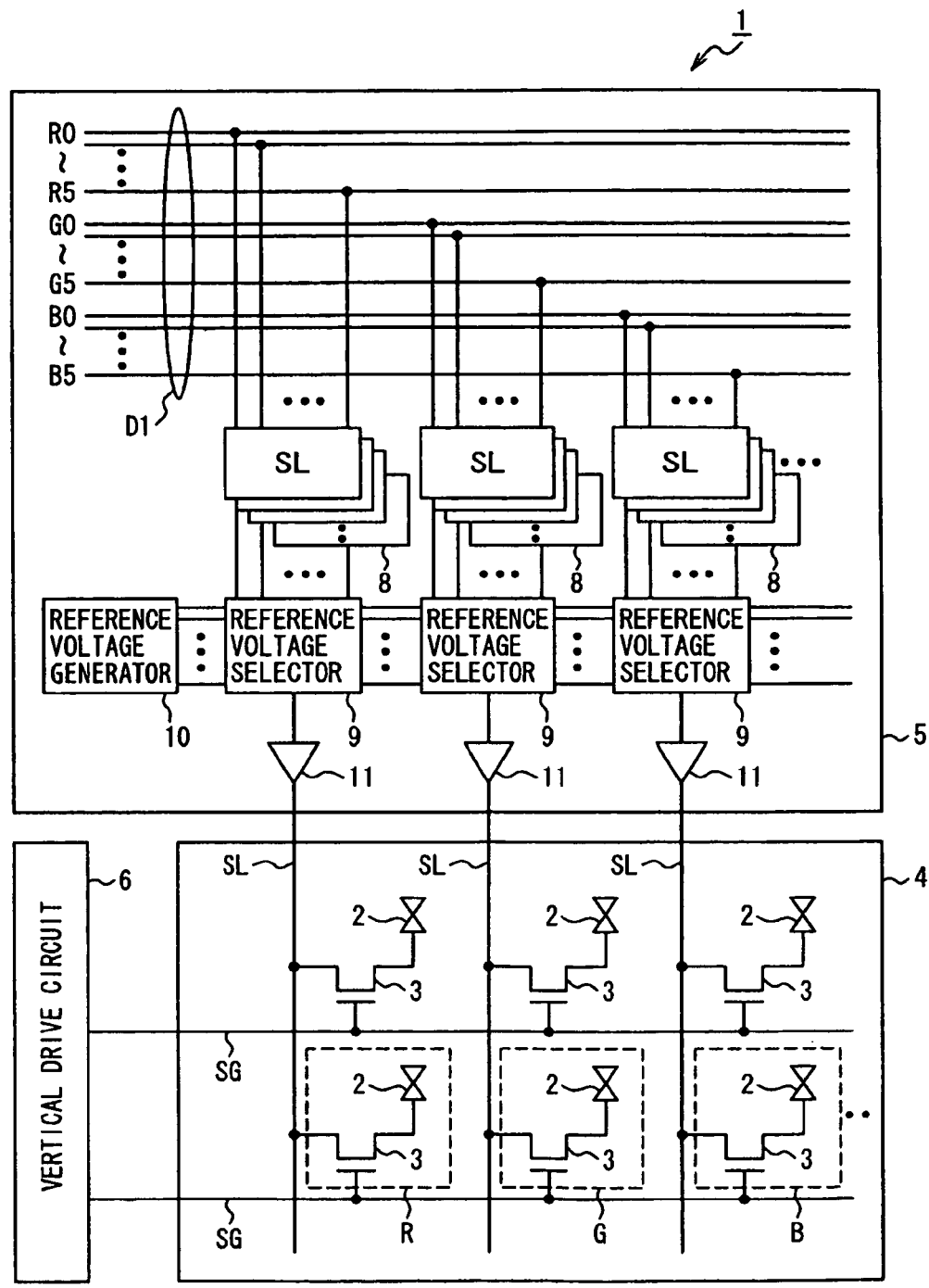
FIG. 1 is a block diagram showing a configuration of a liquid crystal display apparatus.
Figure 2:
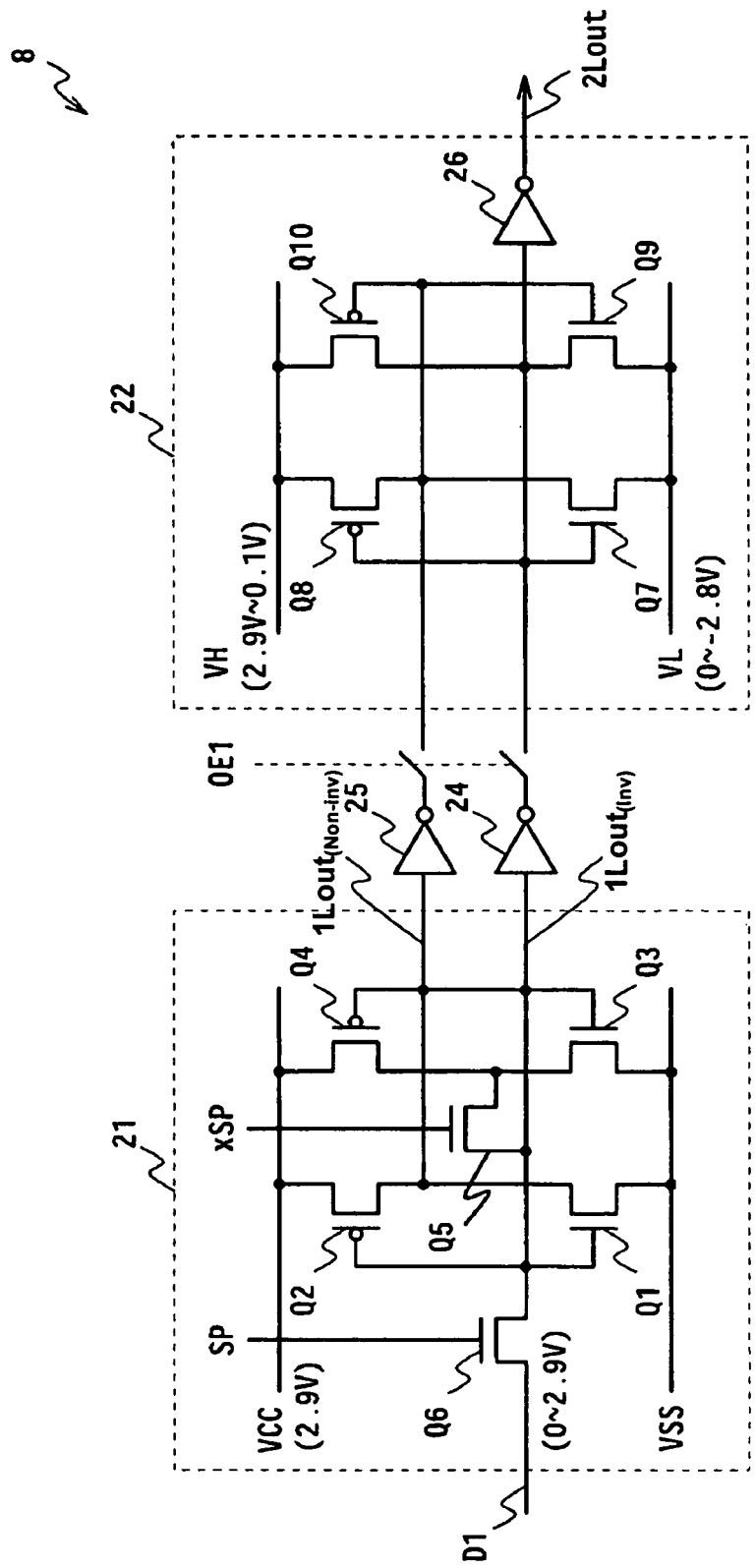
FIG. 2 is a connection diagram showing a sampling latch circuit applied to a conventional liquid crystal display apparatus.
Figure 3:
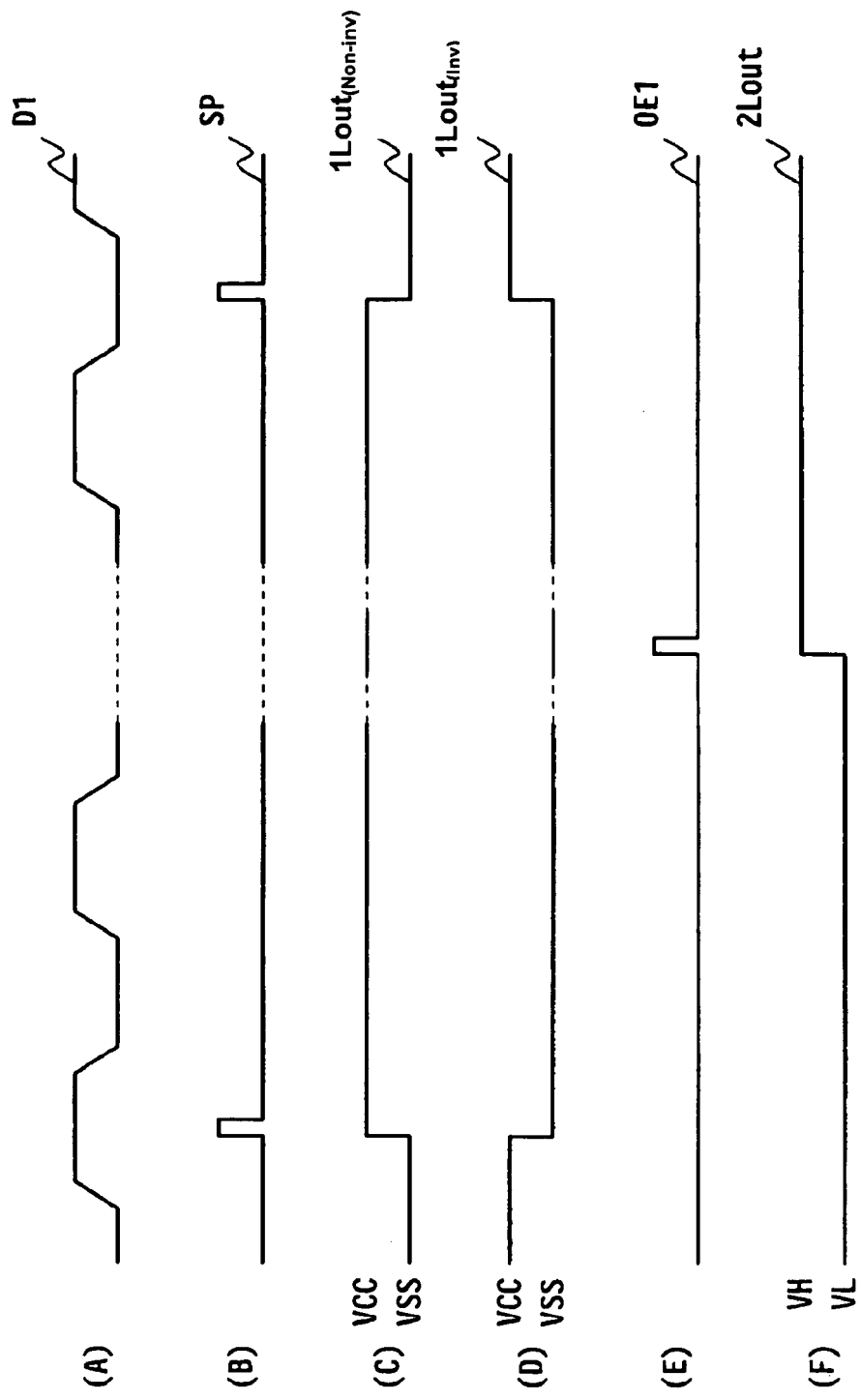
FIG. 3 is a time chart for use in the description of the operation of the sampling latch circuit shown in FIG. 2.
Figure 4:
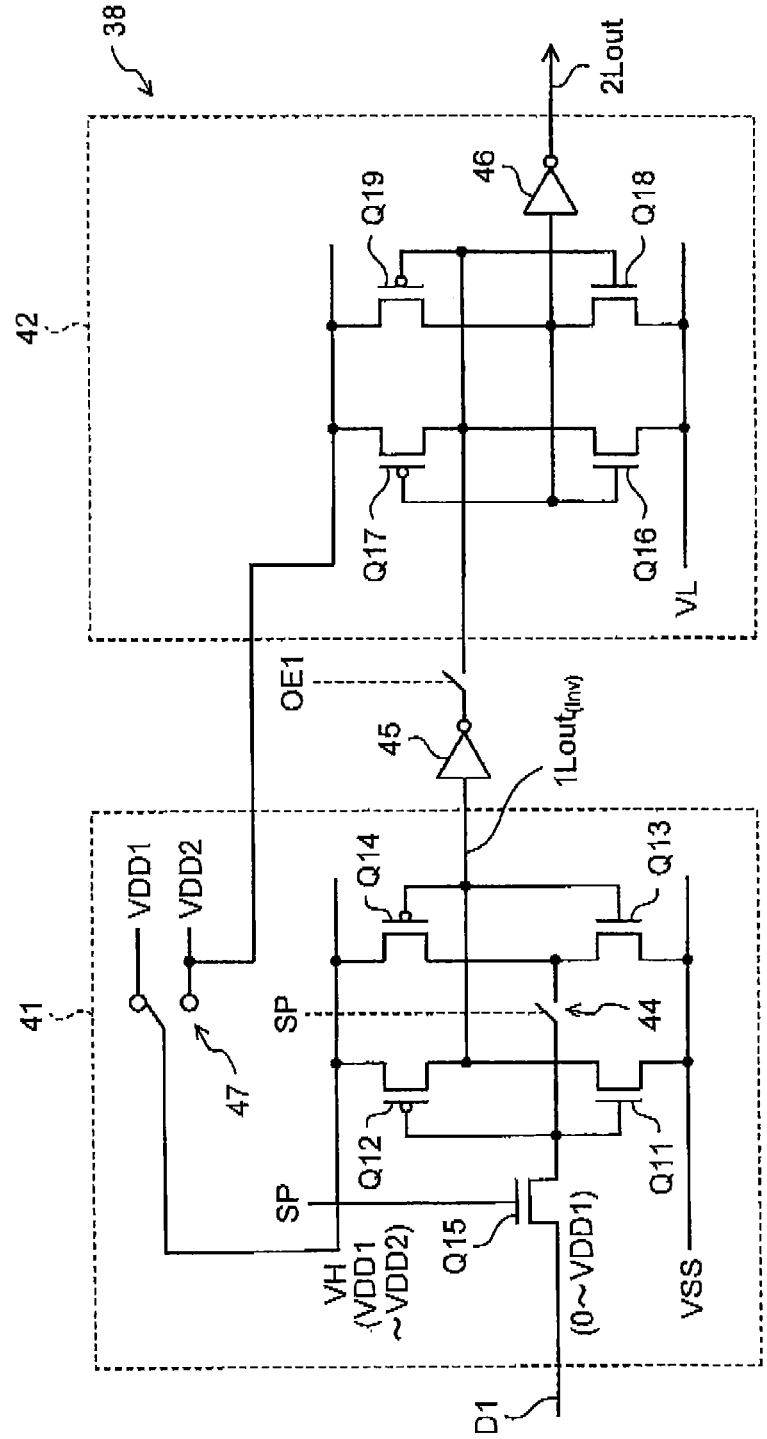
FIG. 4 is a connection diagram showing a sampling latch circuit according to an embodiment of the present invention.

FIG. 4 is a connection diagram showing, in comparison with that shown in FIG. 2, a configuration for one bit portion of a sampling latch circuit to be applied to a liquid crystal display apparatus according to an embodiment of the present invention. Because this liquid crystal display apparatus according to the embodiment of the present invention is configured the same as the liquid crystal display apparatus 1 described with reference to FIGS. 1, 2, except that a configuration of this sampling latch circuit 38 differs therefrom, a duplicative description will be omitted.

In this sampling latch circuit 38, after latching gradation data D1 by the first latch section 41 at a timing corresponding to the disposition of pixels in the horizontal direction, a latch result by this first latch section 41 is transferred to the second latch section 42 at a predetermined timing OE1 in a horizontal blanking period for latching therein, and outputting to a reference voltage selector 9 subsequent thereto. This sampling latch circuit 38 executes data transfer of the latch result from the first latch section 41 to the second latch section 42 by use of a single phase, and secures a margin which becomes deficient due to the single phase data transfer to be compensated by raising the power voltage.

That is, in this sampling latch circuit 38, the first latch section 41 is provided with a CMOS inverter composed of an NMOS transistor Q11 and a PMOS transistor Q12 as well as a CMOS inverter composed of an NMOS transistor Q13 and a PMOS transistor Q14 arranged in parallel between a positive side power supply VH and a negative power supply VSS. In the first latch section 41, an inverter output from the transistors Q11 and Q12 is inputted to the inverter composed of the transistors Q13 and Q14; further, via a switching circuit 44 which operates off-action at a sampling pulse SP, an inverter input from the transistors Q11 and Q12 is inputted to the inverter composed of the transistors Q13 and Q14, and still further, via a PMOS transistor Q15 which operates on-action at a sampling pulse SP, gradation data D1 is inputted to the inverter composed of the transistors Q11 and Q12.

Figure 5:
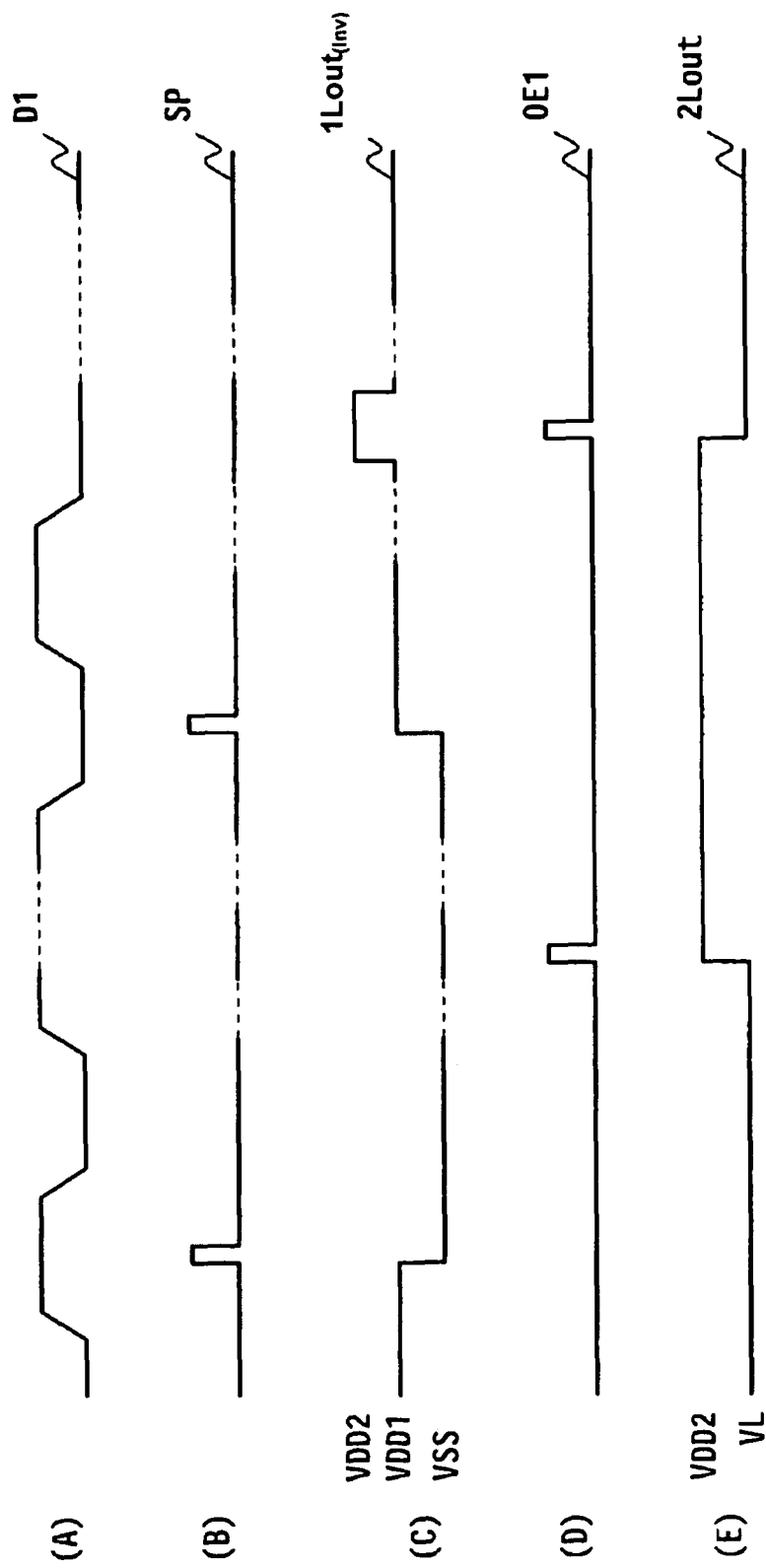
FIG. 5 is a time chart for use in the description of the operation of the sampling latch circuit shown in FIG. 4.

Thereby, in the sampling latch circuit 38, a CMOS latch cell is formed with the transistors Q11 to Q15, and as shown in FIGS. 5 (A)-(C), it is configured such that, after fetching gradation data D1 while setting the switch circuit 44 off-state by a sampling pulse SP, the switch circuit 44 is set to an on-state to hold the gradation data D1 fetched in, and a timing relating to this latch is set in accordance with the position of a corresponding pixel in the horizontal direction.

Furthermore, in the first latch section 41, by selection of a power supply via a switch circuit 47, a processing relating to this latch is executed in a state of setting to a power supply VDD1 of 2.9 V, which is equal to a power supply relating to a pre-stage circuit. Further, immediately before the data transfer of a latch result to the second latch section 42, a power supply VDD2 at 5.8V, which is higher than the voltage at the time of the latching, is selected, and then upon completion of the data transfer, the original power supply VDD1 is selected. Thereby, in this sampling latch circuit 38, at least during the period of data transfer of a latch result from the first latch section 41 to the second latch section 42, the circuit is configured to raise the power supply voltage to secure a margin which drops due to the data transfer of the latch result by use of the single phase.

Thereby, the first latch section 41 is configured, at a predetermined timing OE1 in a horizontal blanking period, so as to transfer the latch result by expanding the amplitude thereof to the second latch section 42 via a transfer switch 45. In this embodiment, an inverted output $1Lout_{(Inv)}$ is applied to the latch result to be supplied to this data transfer (FIGS. 5 (C) to (E)).

The second latch section 42 is provided with a CMOS inverter composed of an NMOS transistor Q16 and a PMOS transistor Q17 as well as a CMOS inverter composed of an NMOS transistor Q18 and a PMOS transistor Q19 arranged in parallel between a positive side power supply VDD2 and a negative side power supply, thereby forming a latch cell in a comparator circuit construction by these CMOS inverters, and then an output from the transfer switch 45 is supplied to this latch cell. Thus, the second latch section 42 is configured to latch the latch result from the first latch section 41, and then to output the output 2Lout of the latch result of the second latch via an inverter 46.

Further, the second latch section 42 is enabled so as to level shift a latch output to be outputted so that the output becomes suitable for processing in the reference voltage selector 9, by setting-up of the negative side power supply VL.

(2) Operation of the Embodiment

According to the configuration described above, in the liquid crystal display apparatus (FIG. 1), gradation data D1 composed of a series of data indicating the gradation of each pixel for use of the display are inputted to the horizontal drive circuit 5, in which these gradation data D1 are sampled sequentially by the sampling latch circuit 38 and arranged per line unit, and then by the reference voltage selector 9 subsequent thereto, a reference voltage V0-V63 is selected in accordance with each gradation data. In the liquid crystal display apparatus 1, a drive signal for driving each pixel is generated by selection of this reference voltage V0 to V63, and this drive signal is supplied to the display unit 4 via the signal line SL, and the drive signal is applied to a pixel that is selected by the vertical drive circuit 6. Thereby, in the liquid crystal display apparatus 1, a desired image is displayed by driving each pixel in the display unit 4 in accordance with corresponding gradation data D1.

In the horizontal drive circuit 5 which drives the display section 4 as described above, in the sampling latch circuit 38 which sequentially and cyclically samples the gradation data D1 as described above (FIG. 4), after each bit of the gradation data D1 being latched in the first latch section 41 at a timing corresponding thereto, the bit is transferred simultaneously and in parallel to the second latch section 42 so as to be latched therein at a predetermined timing OE1 in a horizontal blanking period via each sampling latch circuit 38, and the output 2Lout of the latch result of the second latch is outputted to the reference voltage selector 9. Thereby, in the liquid crystal display apparatus 1, the gradation data D1 is arranged per line unit, and subjected to a digital/analog conversion processing by the reference voltage selector 9.

In the sampling latch circuit 38, the data transfer from the first latch section 41 to the second latch section 42 is carried out by use of the inverted output $1Lout_{(Inv)}$ of the latch result as described above, thus performing the data transfer of the latch result by use of a single phase, and thereby, in comparison with the case of the data transfer by use of a bi-phase, enabling the simplification of the configuration. Specifically, in the transfer switch relating to such data transfer, a minimum of two transistors are necessary in the construction of an inverter. In contrast, in the case of data transfer by use of a single phase as described above, especially in this embodiment, transfer switches for as many portions as 240 pairs×3 (red, green, blue)×6 bits can be omitted, thereby enabling the omission of as many pieces of transistors as 4320×2 in comparison with the case of the data transfer by use of the bi-phase. Thereby, according to this liquid crystal display apparatus, it becomes possible to decrease power consumption through simplification of the configuration and, further, to realize the so-called narrow bezel.

Further, during the period of such data transfer, in the first latch section 41, its power voltage is caused to rise, thereby securing a margin that drops during the data transfer of the latch result by use of the single phase. Thereby, in the liquid crystal display apparatus, the data of the latch result is configured so as to be transferred by use of a single phase, thus enabling the latch result to be transferred to the second latch section 42 stably and reliably.

(3) Advantage of the Embodiment

According to the configuration described above, by an arrangement such that only the inverted output $1Lout_{(Inv)}$ of the latch result in the first latch section is data-transferred to the second latch section and, the at least during the period of the data transfer to the second latch section, the power supply voltage of the first latch section is raised, the construction relating to the data transfer, in its configuration using TFTs, can be simplified.

(4) Other Embodiments

By way of example, in the description of the above embodiment, the case of the data transfer only of the inverted output 1Lout$_{(Inv)}$ of the latch result from the first latch section to the second latch section has been described, however, the present invention is not limited thereto, and it can be applied widely to a case of data transfer only of a non-inverted output of the latch result to the second latch section.

Further, in the description of the above embodiment, the case where the present invention is applied to the TFT liquid crystal which comprises the display section and the like formed on a glass substrate has been described, however, the present invention is not limited thereto, and it can be applied widely to various types of liquid crystal display apparatuses, such as CGS (Continuous Grain Silicon) liquid crystal and the like, and further to various flat display apparatuses, such as an EL (Electro Luminescence) display apparatus and the like.

Still further, in the description of the above embodiment, the case where the present invention is applied to the liquid crystal display apparatus, in which the first and the second latch sections are constructed with active elements composed of low temperature polysilicon TFTs formed on the insulation substrate was described; however, the present invention is not limited thereto, and it can be applied widely to any data transfer circuit for carrying out data transfer in which the first and the second latch sections are formed with various active elements formed on an insulation substrate.

As described hereinabove, according to the present invention, by configuring the invention such that the data of only the inverted output of the latch result of the first latch section or only the non-inverted output thereof is enabled to be transferred to the second latch section and, at least during the period of the data transfer to the second latch section, the power supply voltage of the first latch section is raised, in the configuration with the TFTs and the like, to simplification of the construction relating to the data transfer is enabled.

The present invention relates to a data transfer circuit and a flat display apparatus, and it can be applied to a liquid crystal display apparatus in which a drive circuit is formed integral, for example, on an insulation substrate.

The invention claimed is:

1. A data transfer circuit comprising:
a first latch section that latches an input data inputted to said first latch section, and outputs a single-phase first latch result obtained by latching said input data; and
a second latch section that latches said single-phase first latch result outputted from said first latch section,
wherein said first latch section includes a first inverter and a second inverter, an input from said first inverter being inputted to said second inverter via a switching circuit,
wherein a first power supply voltage of said first latch section is set to a first voltage or a second voltage that is different from said first voltage, and a second power supply voltage of said second latch section is set to said second voltage,
wherein said first power supply voltage of said first latch section is set to said first voltage when the input data inputted and latched in the first latch section, and set to said second voltage while said single-phase first latch result is transferred to said second latch section, and
wherein said single phase first latch result is an inverted output of the first latch result.

2. The data transfer circuit according to claim 1, wherein said second voltage is higher than said first voltage.

3. The data transfer circuit according to claim 1, wherein said second voltage is sufficient to prevent a voltage drop due to the transfer of said single-phase first latch result to said second latch section.

4. The data transfer circuit according to claim 1, wherein said second voltage is 5.8 V.

5. The data transfer circuit according to claim 1, wherein said second voltage is at least 2.9 V greater than said first voltage.

6. The data transfer circuit according to claim 1, wherein said first latch section latches gradation data.

7. The data transfer circuit according to claim 1, wherein said first and second inverters are arranged in parallel between said first power supply voltage and a first negative power supply.

8. The data transfer circuit according to claim 7, wherein said input data is inputted to said first inverter.

9. The data transfer circuit according to claim 1, wherein said switching circuit operates off-action at a sampling pulse.

10. The data transfer circuit according to claim 9, wherein said input data is inputted to said first inverter via a transistor that operates on-action at said sampling pulse.

11. The data transfer circuit according to claim 1, wherein a transfer switch is arranged between said first latch section and said second latch section, an output of said transfer switch being supplied to said second latch section.

12. The data transfer circuit according to claim 1, wherein said second latch section further comprises a third inverter and a fourth inverter, said third and fourth inverters arranged in parallel between said second power supply voltage and a second negative power supply.

13. The data transfer circuit according to claim 12, wherein said first latch result is inputted to said third inverter.

14. The data transfer circuit according to claim 12, wherein said second latch section level shifts said transfer circuit output by setting-up said second negative power supply.

15. The data transfer circuit according to claim 1, wherein said power supply voltage of said first latch section is raised from said first voltage to said second voltage before said single-phase first latch result is transferred to said second latch section.

16. The data transfer circuit according to claim 1, wherein said single phase first latch result is a non-inverted output of the first latch result.

17. The data transfer circuit according to claim 16, wherein said power supply voltage of said first latch section is raised from said first voltage to said second voltage before said single-phase first latch result is transferred to said second latch section.

18. The data transfer circuit according to claim 17, wherein said second voltage is sufficient to prevent a voltage drop due to the transfer of said single-phase first latch result to said second latch section.

19. The data transfer circuit according to claim 1, wherein said input data inputted to said first inverter via a switching element,
while said input data is inputted, said switching element is set to an on-state and said switching circuit is set to an off-state, and
after the inputting of said input data is finished, said switching element is set to an off-state and said switching circuit is set to an on-state.

20. The data transfer circuit according to claim 19, wherein said second voltage is higher than said first voltage.

* * * * *